(12) United States Patent
Asaba

(10) Patent No.: US 7,256,381 B2
(45) Date of Patent: Aug. 14, 2007

(54) DRIVING AN IMAGE SENSOR WITH REDUCED AREA AND HIGH IMAGE QUALITY

(75) Inventor: Tetsuo Asaba, Suwon-Si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 7 days.

(21) Appl. No.: 11/066,987

(22) Filed: Feb. 25, 2005

(65) Prior Publication Data

US 2005/0189472 A1 Sep. 1, 2005

(30) Foreign Application Priority Data

Feb. 27, 2004 (KR) .................. 10-2004-0013575

(51) Int. Cl.
- *H01L 27/00* (2006.01)
- *H01J 40/14* (2006.01)
- *H01N 3/14* (2006.01)

(52) U.S. Cl. .............. 250/208.1; 250/214 R; 348/302; 348/308

(58) Field of Classification Search ......... 250/208.1, 250/214 R, 214 SW, 214.1; 348/302, 308, 348/272, 294; 358/474, 475
See application file for complete search history.

(56) References Cited

U.S. PATENT DOCUMENTS

| | | | |
|---|---|---|---|
| 6,377,304 B1* | 4/2002 | Saitoh | 348/308 |
| 2002/0018131 A1 | 2/2002 | Kochi | |
| 2004/0096124 A1* | 5/2004 | Nakamura | 382/308 |
| 2005/0083421 A1* | 4/2005 | Berezin et al. | 348/308 |

OTHER PUBLICATIONS

Japanese Patent No. JP2000059696 to Seiji, having Publication date of Feb. 25, 2000 (w/ English Abstract page).
Japanese Patent No. JP2001024948 to Hidekazu, having Publication date of Jan. 26, 2001 (w/ English Abstract page).
European Patent Application No. 00307869.8 entitled "Image Pickup Apparatus" to Suda et al. having publication date of Sep. 12, 2000.

* cited by examiner

*Primary Examiner*—Georgia Epps
*Assistant Examiner*—Don Williams
(74) *Attorney, Agent, or Firm*—Monica H. Choi

(57) ABSTRACT

An image sensor includes a set of at least two pixels each sensing light of a same color coupled to a signal converter. A driver simultaneously turns on a respective switching element for transferring a respective photocurrent from a respective photodiode within each of such pixels to the signal converter, for capturing a moving image. Alternatively, the driver separately turns on the respective switching element for sequentially transferring a respective photocurrent from a respective photodiode within each of such pixels to the signal converter, for capturing a still image.

20 Claims, 9 Drawing Sheets

DRIVING AN IMAGE SENSOR WITH REDUCED AREA AND HIGH IMAGE QUALITY

BACKGROUND OF THE INVENTION

This application claims priority to Korean Patent Application No. 2004-13575, filed on Feb. 27, 2004, in the Korean Intellectual Property Office, the disclosure of which is incorporated herein in its entirety by reference.

FIELD OF THE INVENTION

The present invention relates generally to image sensors such as a CMOS (complementary metal oxide semiconductor) image sensor, and more particularly, to driving pixels of an image sensor with reduced area and high image quality.

DESCRIPTION OF THE RELATED ART

In general, an image sensor is a semiconductor device that captures images by sensing light. The image sensor includes an array of hundreds of thousands to millions of pixels that convert light of an image into electrical signals. In addition, an analog-to-digital converter converts such electrical signals that are analog signals into digital signals that are then stored in data storage units.

Semiconductor image sensors are mainly used in digital cameras and camcorders. Digital cameras for capturing still images require millions of pixels, whereas camcorders for capturing moving images require only hundreds of thousands of pixels.

Digital cameras, camcorders, and the like currently commercially available are desired to capture both still and moving images. Thus, an image sensor with millions of pixels, which is suitable for capturing a still image, is also desired to be used for capturing a moving image.

As technology advances, the number of pixels in the semiconductor image sensor is likely to increase. Conventionally, capturing a still image or a moving image using one high resolution semiconductor image sensor such as a CMOS (complementary metal oxide semiconductor) image sensor is performed in two ways.

According to one method, photocurrents from all pixels of the CMOS image sensor are measured to capture the still image. For capturing a moving image, photocurrents from selected pixels at predetermined intervals in an array of pixels are measured to capture the moving image. However, ignoring data from the non-selected pixels degrades the image quality of the moving image.

According to an alternative method also, photocurrents from all pixels of the CMOS image sensor are measured to capture the still image. However in the alternative method, photocurrents of adjacent pixels are combined to capture the moving image. Thus, because data from a substantial portion of the pixels are not ignored, the image quality is improved from the former method.

Nevertheless, a CMOS image sensor (CIS) using primary color filters cannot use the latter method. Furthermore, even when the CIS has a shared floating diffusion (FD) pixel structure, since adjacent pixels have different color filters for a Bayer color pattern, photocurrent signals from adjacent pixels cannot be combined to represent a particular color.

FIG. 1 is a circuit diagram of a conventional CMOS image sensor 100 having a plurality of pixels 101, 102, 103, 104, 105, 106, 107, and 108 and a plurality of signal converters 111, 112, 113, and 114. Each of the pixels 101, 102, 103, 104, 105, 106, 107, and 108 is arranged along rows and columns of an array of the pixels and converts a received light of a respective color into a corresponding photocurrent indicating the intensity of such received light. Each of the pixels 101, 102, 103, 104, 105, 106, 107, and 108 is comprised of a respective photodiode PD and a respective transfer MOSFET between the respective photodiode and one of the signal converters 111, 112, 113, and 114.

Each of the photodiodes PD is for receiving a respective color defined by a color filter disposed thereon. Photodiodes PD with a label R1 or R2 are for receiving red colored light, photodiodes PD with a label B1 or B2 are for receiving blue colored light, and photodiodes PD with a label Ga1, Ga2, Gb1, or Gb2 are for receiving green colored light. Each of the signal converters 111, 112, 113, and 114 converts photocurrent output from any of the pixels 101, 102, 103, 104, 105, 106, 107, and 108 coupled thereto into an output voltage Vout.

The CMOS image sensor 100 of FIG. 1 has a shared FD pixel structure in which each of the signal converters 111, 112, 113, and 114 is coupled to a corresponding pair of two adjacent pixels along a column of the array of pixels to reduce the area of the CMOS image sensor 100. For capturing a still image, the two adjacent pixels connected to a signal converter separately and sequentially output a respective photocurrent to the signal converter.

The array of pixels in the CMOS image sensor 100 have a Bayer color pattern with the pixels being for receiving alternating colors along a column or a row. Thus, the pixels 101, 102, 103, and 104 in the first column are for receiving lights of alternating colors of red, green, red, and green, respectively. Similarly, the pixels 105, 106, 107, and 108 in the second column are for receiving lights of alternating colors of green, blue, green, and blue, respectively.

Accordingly, in the CMOS image sensor 100 of FIG. 1, each signal converter 111, 112, 113, or 114 is connected to two adjacent pixels with different color filters. Thus, such a signal converter cannot combine the photocurrent signals from such adjacent pixels for simplified signal processing. That is, for capturing the moving image, the CMOS image sensor 100 would process photocurrent data from a portion of the array of pixels selected at predetermined intervals or would separately measure the photocurrents for all pixels and perform an averaging through image signal processing (ISP).

However, capturing the moving image from photocurrents of a portion of the array of pixels results in low image quality. Alternatively, capturing the moving image by separately measuring the photocurrents for all pixels and averaging through ISP requires high frequency operation and high power consumption. Nevertheless, a shared FD pixel structure is desired for reducing the area of the CMOS image sensor 100.

Thus, a mechanism for driving the pixels of an image sensor having a shared FD pixel structure with high image quality is desired.

SUMMARY OF THE INVENTION

Accordingly, at least two pixels each sensing light of a same color are coupled to a common signal converter in embodiments of the present invention.

In a general aspect of the present invention, an image sensor includes a first set of at least two pixels each sensing light of a same first color. In addition, a signal converter is coupled to the first set of pixels. Furthermore, a driver turns on a respective switching element within each pixel of the first set for simultaneously coupling a respective photocurrent from a respective photodiode for each pixel of the first set to the signal converter.

In an embodiment of the present invention, the first set of pixels is within a same column of an array of pixels of the image sensor. The first set is comprised of two pixels that are non-adjoining in the column. For example, another one pixel for sensing a different color is disposed between the two pixels. In another example embodiment, only the two pixels are coupled to the signal converter.

In a further embodiment of the present invention, the image sensor further includes a second set of at least two pixels each for sensing a same second color and each coupled to the signal converter. In that case, the driver turns on a respective switching element within each pixel of the second set for simultaneously coupling a respective photocurrent from a respective photodiode for each pixel of the second set to the signal converter. The respective photocurrent for each pixel of only one of the first or second sets of pixels is simultaneously coupled to the signal converter, for capturing a moving image.

In an example embodiment of the present invention, the array of pixels of the image sensor have a Bayer color pattern, and a pixel from the first set and a pixel from the second set alternate along a column of the array.

The present invention may be used to particular advantage when the driver simultaneously couples the respective photocurrent from the respective photodiode for each pixel of the first set to the signal converter, for capturing a moving image in a CMOS image sensor. Alternatively, the driver separately couples the respective photocurrent from the respective photodiode for each pixel of the first set to the signal converter, for capturing a still image in the CMOS image sensor.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, 7, 8, and 9 refer to elements having similar structure and/or function.

DETAILED DESCRIPTION OF THE INVENTION

Figure 1:
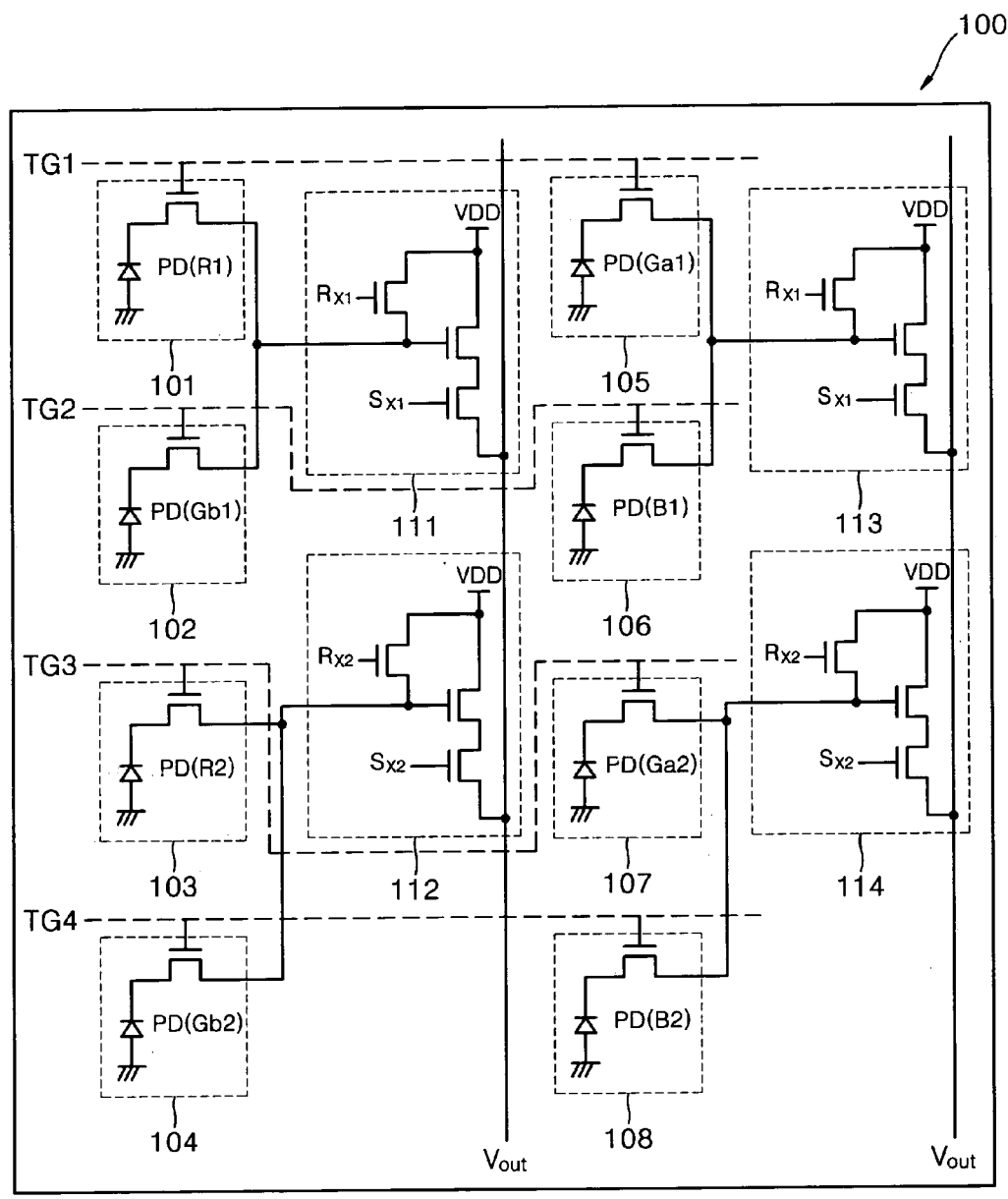
FIG. 1 is a circuit diagram of a CMOS image sensor with a conventional shared FD pixel structure, according to the prior art.
Figure 2:
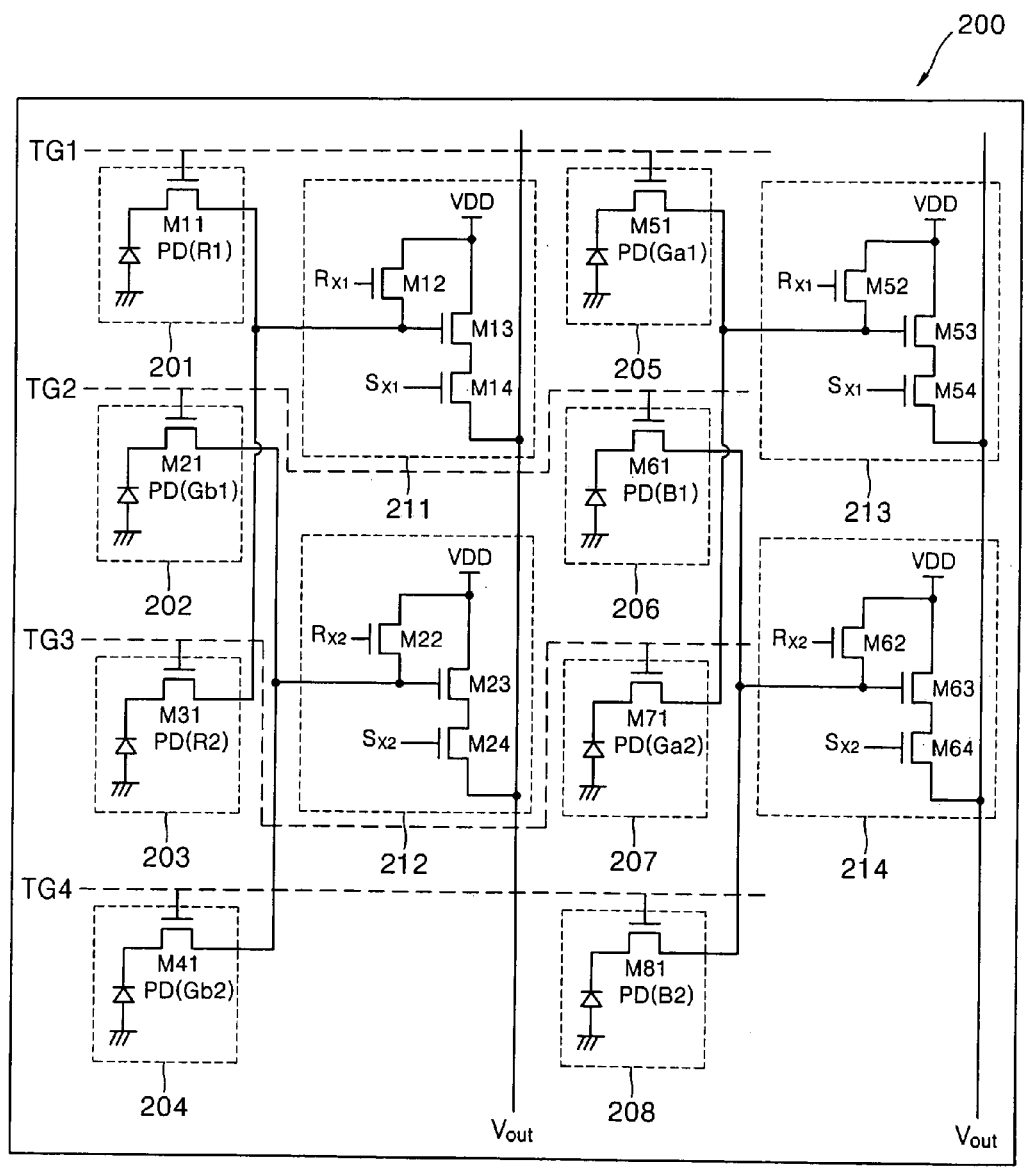
FIG. 2 is a partial circuit diagram of a CMOS image sensor with a shared FD pixel structure according to an embodiment of the present invention.

FIG. 2 is a partial circuit diagram of a CMOS image sensor 200 according to an embodiment of the present invention. The CMOS image sensor 200 includes a plurality of pixels 201, 202, 203, 204, 205, 206, 207, and 208, and a plurality of signal converters 211, 212, 213, and 214.

Each of the pixels 201, 202, 203, 204, 205, 206, 207, and 208 is arranged along rows and columns of an array of the pixels and converts a received light of a respective color into a corresponding photocurrent indicating the intensity of such received light. Each of the pixels 201, 202, 203, 204, 205, 206, 207, and 208 is comprised of a respective photodiode PD and a respective transfer MOSFET between the respective photodiode and one of the signal converters 211, 212, 213, and 214. Thus, the pixels 201, 202, 203, 204, 205, 206, 207, and 208 each include a photodiode PD(R1), PD(Gb1), PD(R2), PD(Gb2), PD(Ga1), PD(B1), PD(Ga2), and PD(B2), respectively, and each include a transfer MOSFET (metal oxide semiconductor field effect transistor) M11, M21, M31, M41, M51, M61, M71, and M81, respectively.

Each of the photodiodes PD is for receiving light of a respective color defined by a color filter disposed thereon. Photodiodes PD with a label R1 or R2 are for receiving red colored light, photodiodes PD with a label B1 or B2 are for receiving blue colored light, and photodiodes PD with a label Ga1, Ga2, Gb1, or Gb2 are for receiving green colored light. Each of the signal converters 211, 212, 213, and 214 converts photocurrent output from any of the pixels 201, 202, 203, 204, 205, 206, 207, and 208 coupled thereto into an output voltage Vout.

The CMOS image sensor 200 has a shared FD (floating diffusion) pixel structure with each of the signal converters 211, 212, 213, and 214 being coupled to a set of two pixels for receiving light of a same color. Each signal converter receives and converts a respective photocurrent from such two pixels into an electrical signal.

In addition, note that the array of pixels in the CMOS image sensor 200 have a Bayer color pattern. In that case, the pixels for receiving red light are disposed alternately with pixels for receiving green light in the first column, and the pixels for receiving blue light are disposed alternately with pixels for receiving green light in the second column.

Thus, the signal converter 211 is coupled to the two non-adjoining pixels 201 and 203 for receiving red light, with the pixel 202 for receiving green light disposed between such two pixels 201 and 203 along the first column of pixels. The signal converter 212 is coupled to the two non-adjoining pixels 202 and 204 for receiving green light, with the pixel 203 for receiving red light disposed between such two pixels 202 and 204 along the first column of pixels.

Similarly, the signal converter 213 is coupled to the two pixels 205 and 207 for receiving green light with the pixel 206 for receiving blue light disposed between such two pixels 205 and 207 along the second column of pixels. The signal converter 214 is coupled to the two pixels 206 and 208 for receiving blue light, with the pixel 207 for receiving green light disposed between such two pixels 206 and 208 along the second column of pixels.

The signal converter 211 includes a reset MOSFET M12, a drive MOSFET M13, and a select MOSFET M14. Each of the other signal converters 212, 213, and 214 similarly includes a reset MOSFET, a drive MOSFET, and a select MOSFET. The reset MOSFET within each signal converter responds to a reset control signal Rx1 or Rx2 for resetting a pixel. The drive MOSFET within each signal converter has a gate coupled to the floating diffusion region for converting the photocurrent from a photodiode into a voltage. The select MOSFET is coupled to the drive MOSFET and responds to a select control signal Sx1 or Sx2 for selectively outputting the voltage output from the drive MOSFET to an external output line for generating Vout.

The CMOS image sensor 200 typically includes millions of pixels but the eight pixels 201, 202, 203, 204, 205, 206, 207, and 208 are shown in FIG. 2 for simplicity of illustration and description.

Figure 3:
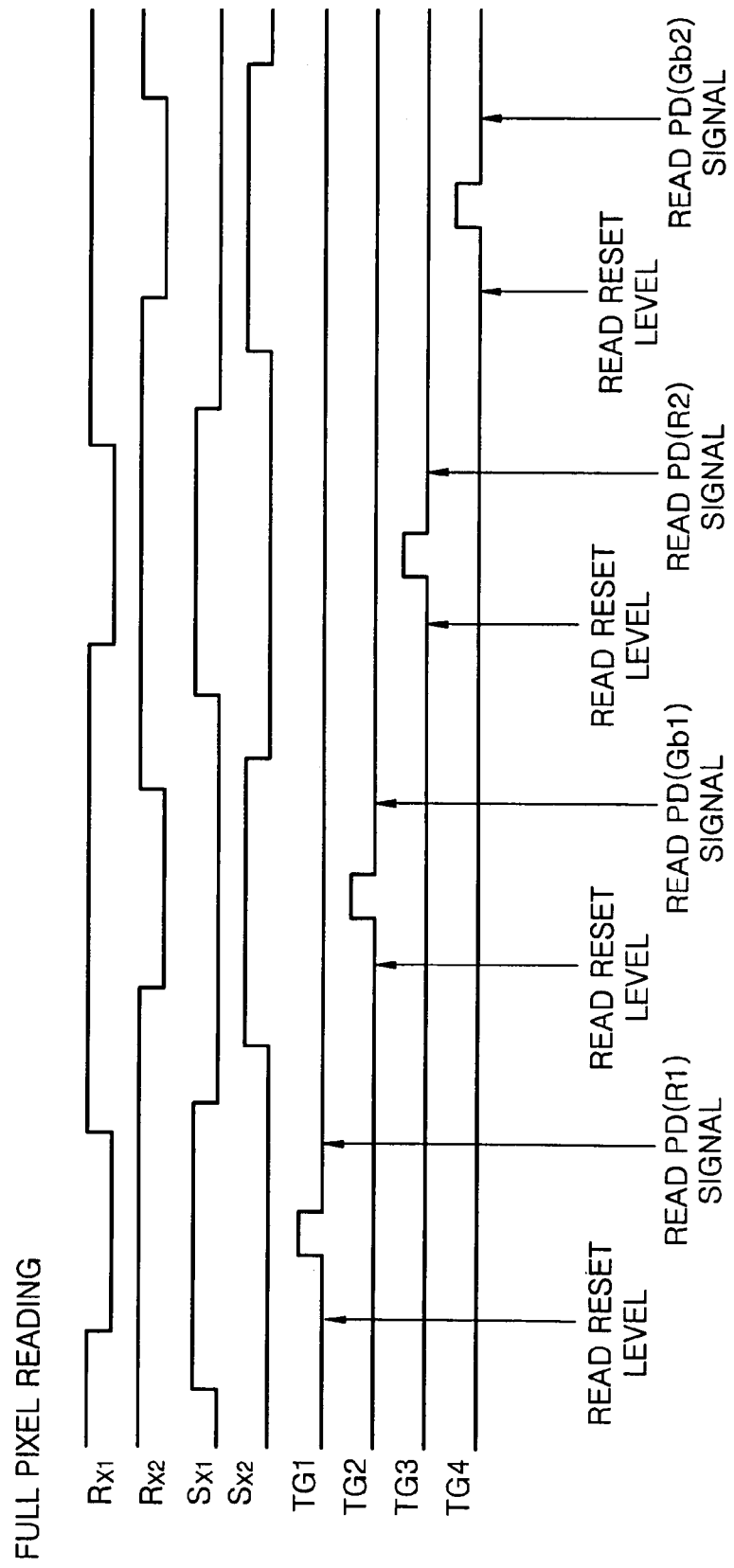
FIG. 3 is a signal timing diagram for capturing a still image using the CMOS image sensor of FIG. 2, according to an embodiment of the present invention.
Figure 8:
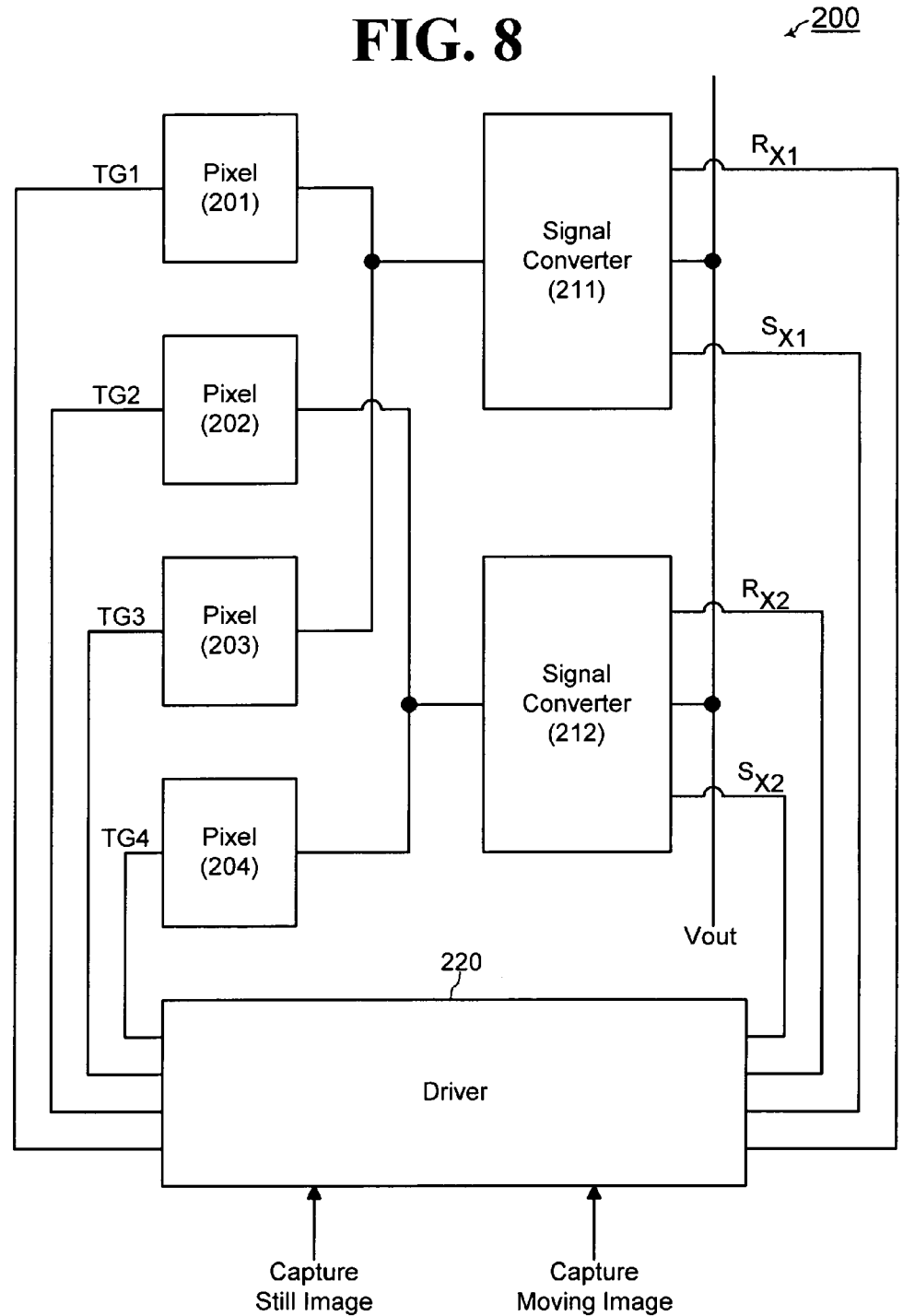
FIG. 8 is a block diagram for one column of the CMOS image sensor of FIG. 2 further including a driver for generating control signals of FIGS. 3 and 4, according to an embodiment of the present invention.

FIG. 3 is a signal timing diagram of control signals Rx1, Rx2, Sx1, Sx2, TG1, TG2, TG3, and TG4 when the CMOS image sensor 200 of FIG. 2 captures a still image. FIG. 8 shows a block diagram of the first column of pixels 201, 202, 203, and 204 and the signal converters 211 and 212 in FIG. 2. Additionally referring to FIG. 8, the CMOS image sensor 200 includes a driver 220 for generating the control signals Rx1, Rx2, Sx1, Sx2, TG1, TG2, TG3, and TG4 of FIGS. 3 and 4.

Referring to FIGS. 2 and 3, the reset control signal Rx1 is coupled to the gates of the reset MOSFETs M12 and M52 for resetting the pixels 201 and 205 along a same row, and pixels 203 and 207 along another same row. Similarly, the reset control signal Rx2 is coupled to the gates of the reset MOSFETs M22 and M62 for resetting the pixels 202 and 206 along a same row, and 204 and 208 along another same row.

The select control signal Sx1 is coupled to the gates of the select MOSFETs M14 and M54 for transferring respective voltages generated by respective drive MOSFETs M13 and M53 as respective output voltages Vout along a same row of signal converters 211 and 213. Similarly, the select control signal Sx2 is coupled to the gates of the select MOSFETs M24 and M64 for transferring respective voltages generated by respective drive MOSFETs M23 and M63 as respective output voltages Vout along a same row of signal converters 212 and 214.

The transfer control signal TG1 is coupled to the gates of the transfer MOSFETs M11 and M51 for the first row of pixels 201 and 205. The transfer control signal TG2 is coupled to the gates of the transfer MOSFETs M21 and M61 for the second row of pixels 202 and 206. The transfer control signal TG3 is coupled to the gates of the transfer MOSFETs M31 and M71 for the third row of pixels 203 and 207. The transfer control signal TG4 is coupled to the gates of the transfer MOSFETs M41 and M81 for the fourth row of pixels 204 and 208.

The CMOS image sensor 200 of FIG. 2 uses a correlated double sampling (CDS) method for capturing images of high quality. Such a CDS method removes noise by measuring a reset voltage in a reset state and an image signal voltage generated from the photocurrent of a photodiode for determining a difference between such an image signal voltage and such a the reset voltage. Such a CDS method is individually known to one of ordinary skill in the art of image sensors.

Referring to FIGS. 2 and 3, when the CMOS image sensor 200 captures a still image, the photocurrents from the pixels along each column of pixels are sequentially and separately measured. Such sequential and separate measurement for the first column of pixels 201, 202, 203, and 204 is now described.

Referring to FIGS. 2 and 3, the reset control signals Rx1 and Rx2 are initially set to logic high while the transfer control signals TG1, TG2, TG3, and TG4 are logic low for resetting the pixels. Thereafter, after the reset control signal Rx1 is logic low and the select control signal Sx1 is logic high, the reset voltage for the first pixel 201 is output as Vout (left-most arrow in FIG. 3).

Thereafter, when the transfer control signal TG1 is logic high as a pulse signal to turn on the transfer MOSFET M11 of the pixel 201, a photocurrent from the photodiode PD(R1) of the pixel 201 is transferred to the floating diffusion region (i.e., the gate of the drive MOSFET M13). Subsequently, an image signal voltage corresponding to such photocurrent is output as Vout (second arrow from the left in FIG. 3). In the CDS method, the difference between the image signal voltage and the reset voltage for the first pixel 201 is used for indicating the intensity of red light received by the pixel 201.

Subsequently, the reset control signals Rx1 and Rx2 are logic high while the transfer control signals TG1, TG2, TG3, and TG4 are logic low for resetting the pixels. The control signals Rx1, Rx2, Sx1, Sx2, and TG2 are controlled similarly for the pixel 202 to generate the corresponding reset voltage and the corresponding image signal voltage as Vout (third and fourth arrows from the left in FIG. 3).

In addition, the control signals Rx1, Rx2, Sx1, Sx2, and TG3 are controlled similarly for the pixel 203 to generate the corresponding reset voltage and the corresponding image signal voltage as Vout (fifth and sixth arrows from the left in FIG. 3). Furthermore, the control signals Rx1, Rx2, Sx1, Sx2, and TG4 are controlled similarly for the pixel 204 to generate the corresponding reset voltage and the image signal voltage as Vout (seventh and eight arrows from the left in FIG. 3).

In this manner, voltages from each of the pixels 201, 202, 203, and 204 along the first column are generated as Vout separately and sequentially for capturing a still image. Thus, the select MOSFETs M14 and M24 within the signal converters 211 and 212 are turned on alternately.

Similarly, the voltages from each of the pixels 205, 206, 207, and 208 along the second column are generated as Vout separately and sequentially for capturing the still image. Thus, the select MOSFETs M54 and M64 within the signal converters 213 and 214 are turned on alternately.

Figure 4:
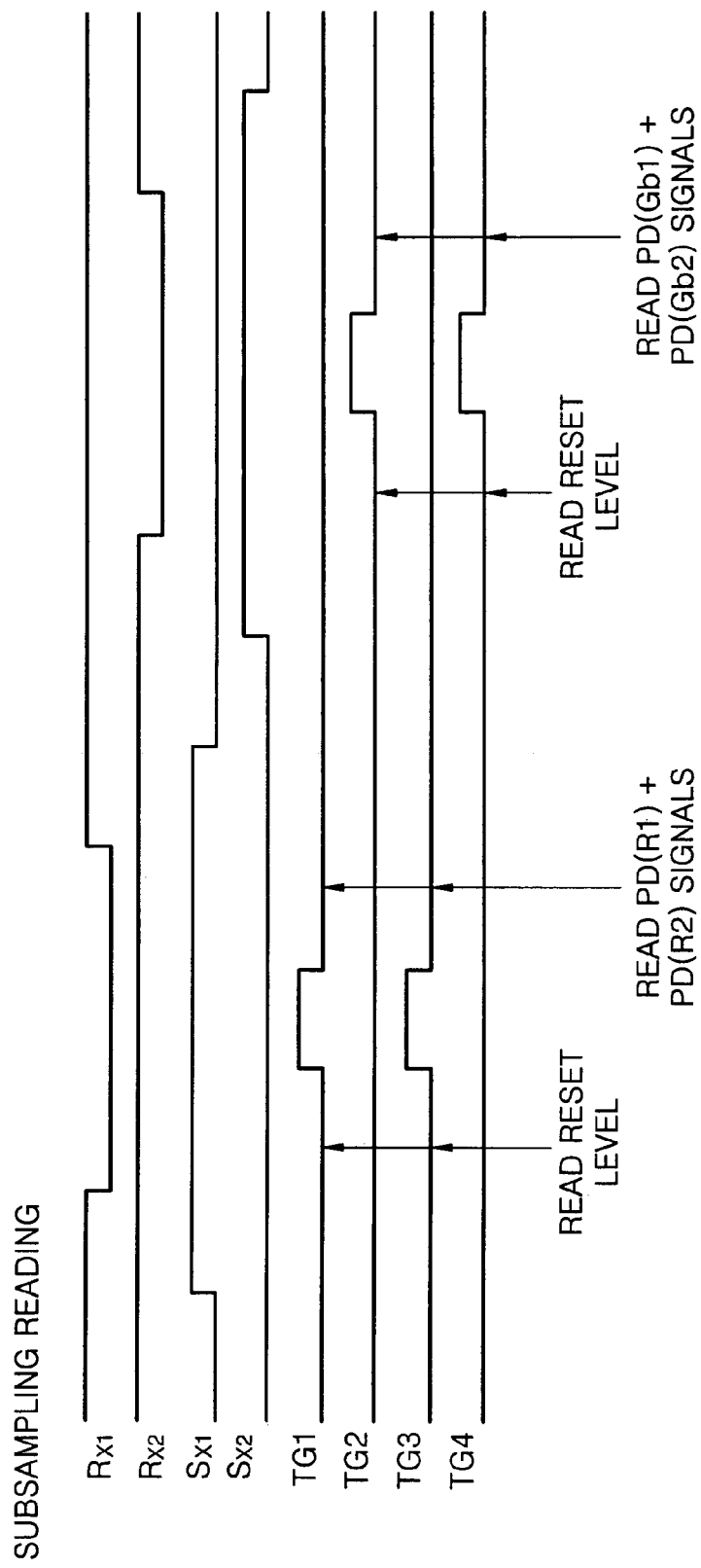
FIG. 4 is a signal timing diagram for capturing a moving image using the CMOS image sensor of FIG. 2, according to an embodiment of the present invention.

FIG. 4 is a signal timing diagram of control signals Rx1, Rx2, Sx1, Sx2, TG1, TG2, TG3, and TG4 generated by the driver 220 of FIG. 8 when the CMOS image sensor 200 of FIG. 2 captures a moving image. Control signals from a controller (not shown) indicate to the driver 220 whether a still image or a moving image is to be captured.

Initially, the reset control signals Rx1 and Rx2 are initially set to logic high while the transfer control signals TG1, TG2, TG3, and TG4 are logic low for resetting the pixels. Thereafter, after the reset control signal Rx1 is logic low and the select control signal Sx1 is logic high, the reset voltage for the non-adjoining pixels 201 and 203 is output as Vout (left-most arrows in FIG. 4).

Subsequently, transfer control signals TG1 and TG3 applied on the transfer MOSFETs M11 and M31 are simultaneously activated to logic high as pulse signals. Thus, the photocurrents from the two non-adjoining pixels 201 and 203 for receiving red light are transferred to the floating diffusion area (i.e., the gate of M13). Such photocurrents are summed at the gate of M13 to generate a corresponding image signal voltage as Vout for the two non-adjoining pixels 201 and 203 (second arrows from the left in FIG. 4).

In addition, the control signals Rx1, Rx2, Sx1, Sx2, TG2 and TG4 are controlled similarly for the non-adjoining pixels 202 and 204. Thus, the reset voltage for the pixels 202 and 204 are generated as Vout when the reset control signal Rx2 is logic low and the select control signal Sx2 is logic high for the signal converter 212 (third arrows from the left in FIG. 4). In addition, the image signal voltage that includes a sum of the photocurrents from the pixels 202 and 204 for receiving green light is generated as Vout after both transfer control signals TG2 and TG4 are activated to logic high (fourth arrows from the left in FIG. 4).

The signal converters 213 and 214 for the second column of pixels 205, 206, 207, and 208 operate similarly. Thus, the signal converter 213 generates an image signal voltage as Vout for the non-adjoining pixels 205 and 207 from a sum of the photocurrents from such pixels 205 and 207 for receiving green light, and the signal converter 214 subsequently generates an image signal voltage Vout for the non-adjoining pixels 206 and 208 from a sum of the photocurrents from such pixels 206 and 208 for receiving blue light.

In this manner, photocurrents from multiple pixels are added before the image signal voltage is generated as Vout for capturing a moving image in the CMOS image sensor 200. Thus, the CMOS image sensor 200 has lower operating frequency and power consumption than the conventional image sensor that reads all pixels with averaging through image signal processing (ISP).

In addition, because photocurrents from all pixels are processed, moving images of high quality are captured. Furthermore, with the shared FD pixel structure, the area of the CMOS image sensor 200 is reduced.

Figure 5:
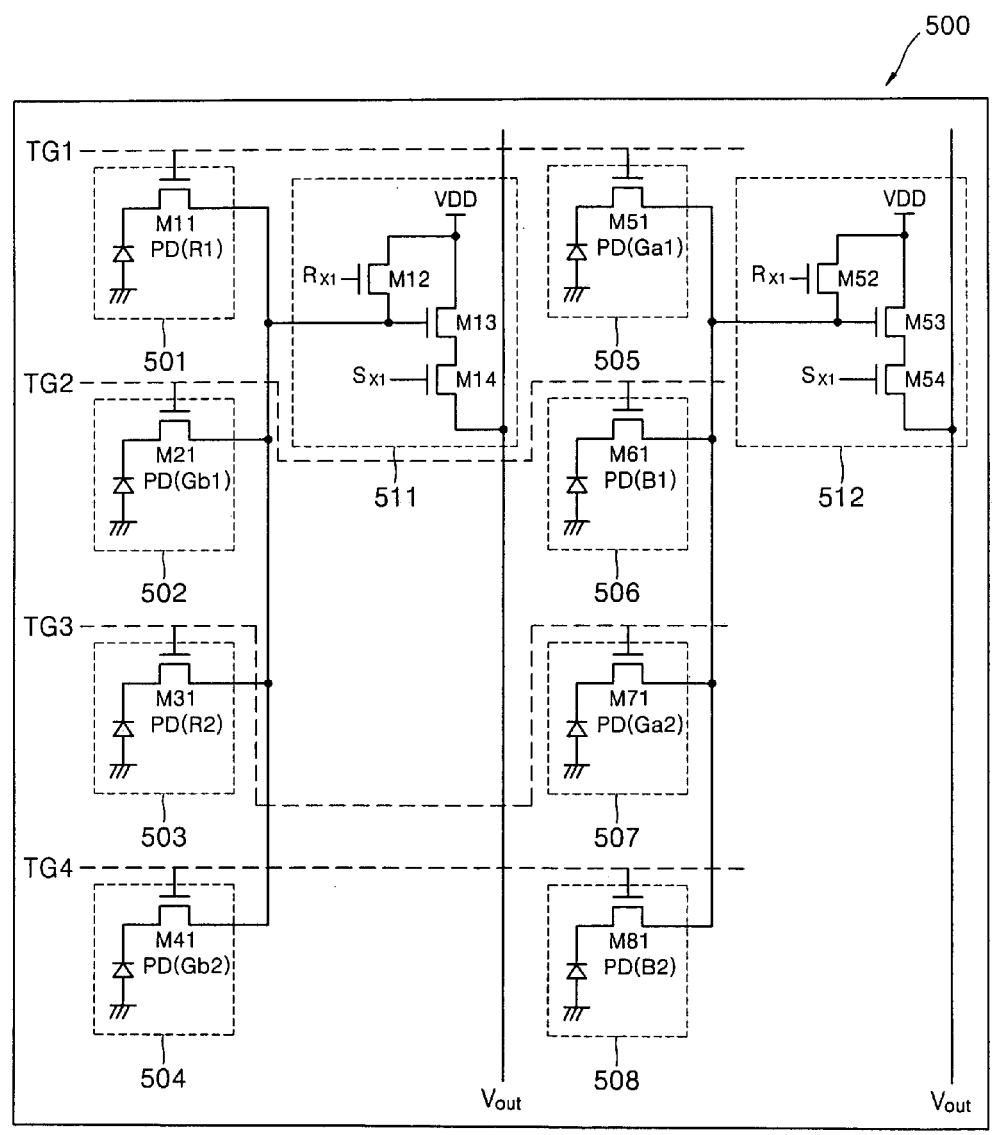
FIG. 5 is a partial circuit diagram of a CMOS image sensor with a shared FD pixel structure according to another embodiment of the present invention.

FIG. 5 is a partial circuit diagram of a CMOS image sensor 500 according to another embodiment of the present invention. The CMOS image sensor 500 typically has millions of pixels arranged in row and columns, but eight pixels 501, 502, 503, 504, 505, 506, 507, and 508 are shown in FIG. 5 for simplicity of illustration and description.

Referring to FIG. 5, the CMOS image sensor 500 includes the plurality of pixels 501, 502, 503, 504, 505, 506, 507, and 508 similar to the pixels 201, 202, 203, 204, 205, 206, 207, and 208, respectively of FIG. 2. In addition, the CMOS image sensor 500 includes signal converters 511 and 512 similar to the signal converters 211 and 213 respectively of FIG. 2.

However, in the CMOS image sensor 500 of FIG. 5, the signal converter 511 is coupled to a first set of non-adjoining pixels 501 and 503 for receiving red light and to a second set of non-adjoining pixels 502 and 504 for receiving green light. Pixels of the first set are disposed alternately with pixels of the second set in the Bayer color pattern for the first column of pixels 501, 502, 503, and 504.

Similarly, the signal converter 512 is coupled to a first set of non-adjoining pixels 505 and 507 for receiving green light and to a second set of non-adjoining pixels 506 and 508 for receiving blue light. Pixels of the first set are disposed alternately with pixels of the second set in the Bayer color pattern for the second column of pixels 505, 506, 507, and 508.

Figure 6:
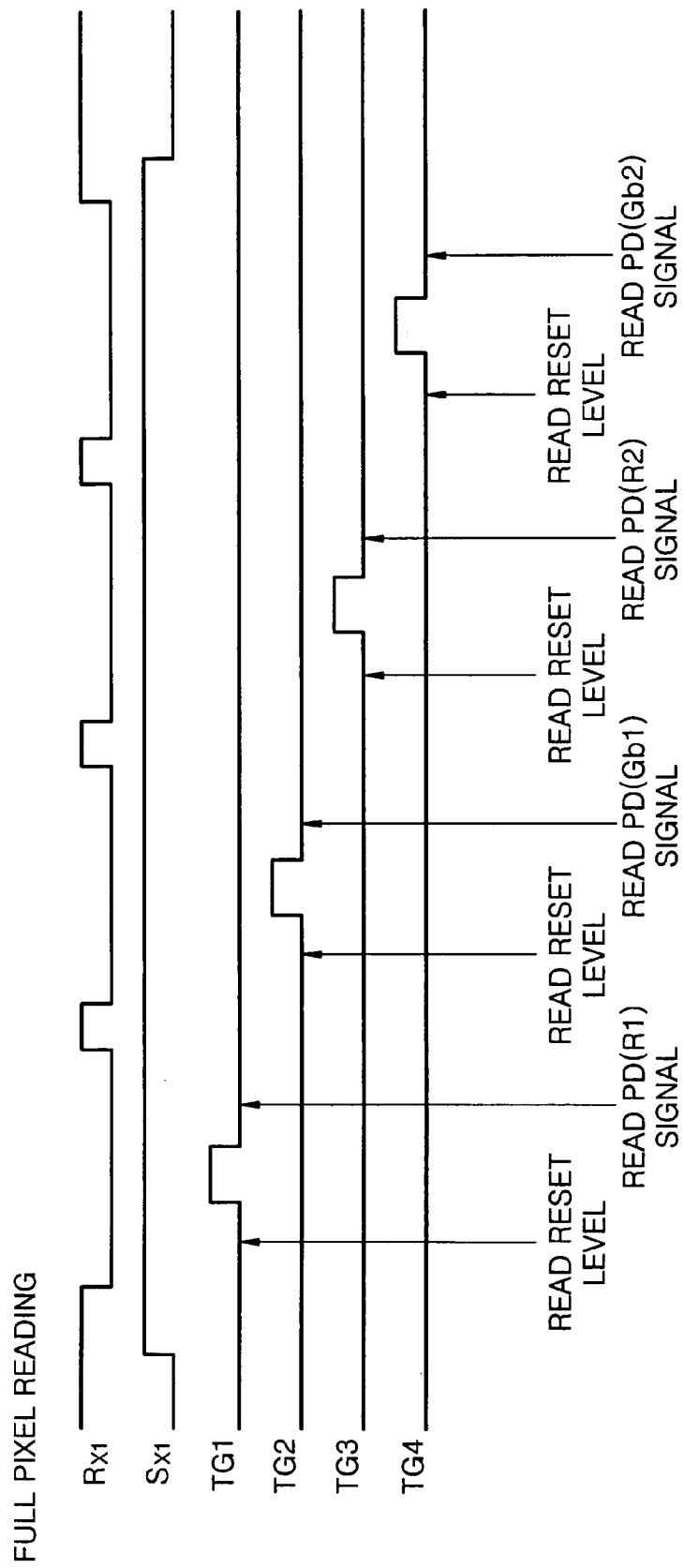
FIG. 6 is a signal timing diagram for capturing a still image using the CMOS image sensor of FIG. 5, according to an embodiment of the present invention.
Figure 9:
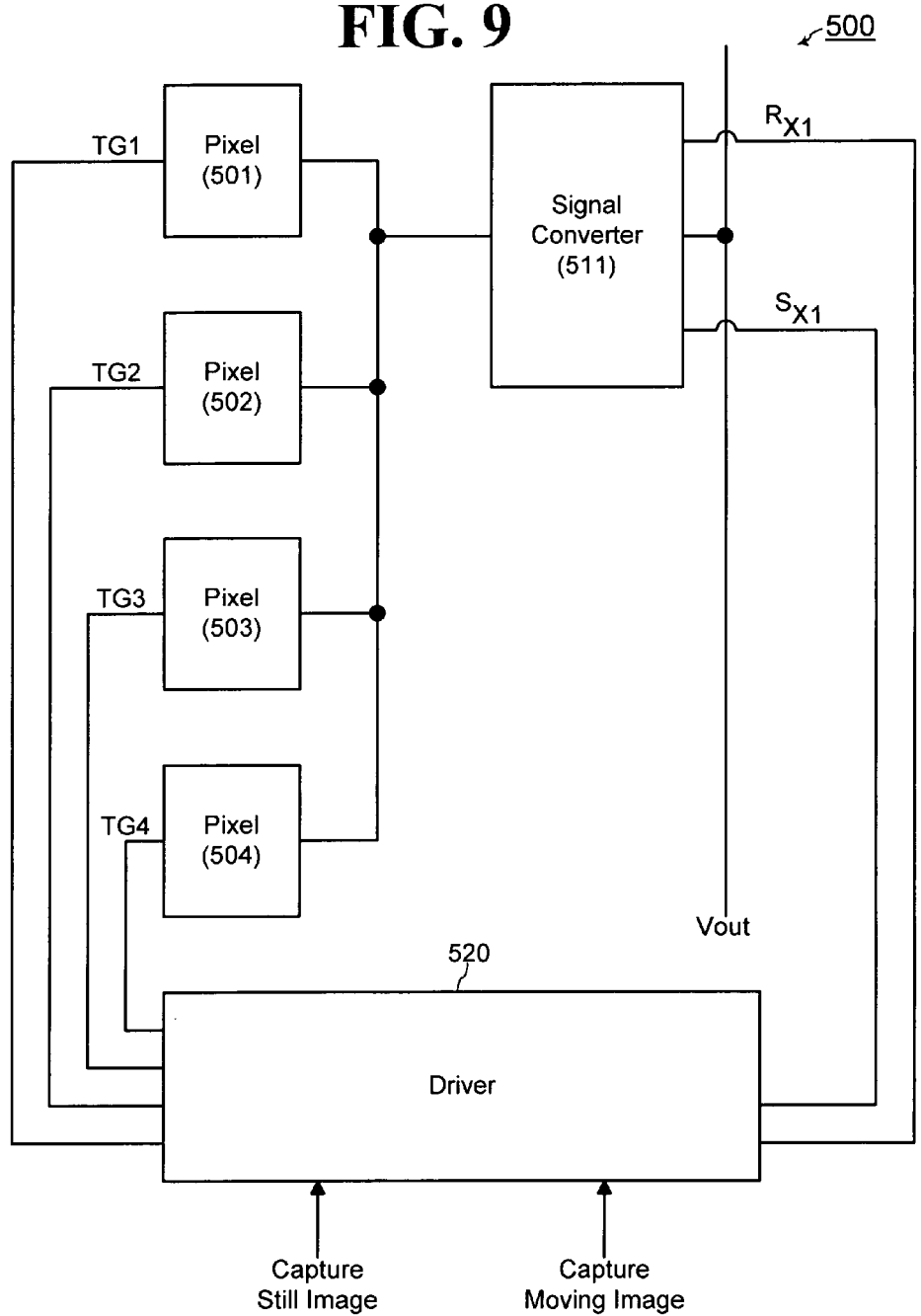
FIG. 9 is a block diagram for one column of the CMOS image sensor of FIG. 5 further including a driver for generating control signals of FIGS. 6 and 7, according to an embodiment of the present invention.

FIG. 6 is a signal timing diagram of control signals Rx1, Rx2, Sx1, Sx2, TG1, TG2, TG3, and TG4 when the CMOS image sensor 500 of FIG. 5 captures a still image. FIG. 9 shows a block diagram of the first column of pixels 501, 502, 503, and 504 and the signal converter 511 in FIG. 5. Additionally referring to FIG. 9, the CMOS image sensor 500 includes a driver 520 for generating the control signals Rx1, Sx1, TG1, TG2, TG3, and TG4 of FIGS. 7 and 8.

Referring to FIG. 6, when the CMOS image sensor 500 captures a still image, the photocurrents from the pixels along each column of pixels are separately and sequentially measured. Such separate and sequential measurement for the first column of pixels 501, 502, 503, and 504 is now described.

Referring to FIGS. 5 and 6, the reset control signal Rx1 is initially set to logic high while the transfer control signals TG1, TG2, TG3, and TG4 are logic low for resetting the pixels. Thereafter, after the reset control signal Rx1 is logic low and the select control signal Sx1 is logic high, the reset voltage for the first pixel 501 is output as Vout (left-most arrow in FIG. 6).

Thereafter, when transfer control signal TG1 is logic high as a pulse signal to turn on the transfer MOSFET M11 of the pixel 501, a photocurrent from the photodiode PD(R1) of the pixel 501 is transferred to the floating diffusion region (i.e., the gate of the drive MOSFET M13). Subsequently, an image signal voltage corresponding to such photocurrent is output as Vout (second arrow from the left in FIG. 6). In the CDS method, the difference between the image signal voltage and the reset voltage for the first pixel 501 is used for indicating the intensity of red light received by the pixel 501.

Subsequently, the reset control signal Rx1 is logic high while the transfer control signals TG1, TG2, TG3, and TG4 are logic low for resetting the pixels, and thereafter the reset voltage for the pixel 502 is output as Vout (third arrow from the left in FIG. 6). The transfer control signal TG2 is then activated to logic high for generating an image signal voltage of the pixel 502 as Vout (fourth arrow from the left in FIG. 6).

In addition, the control signals Rx1, Sx1, and TG3 are controlled similarly for the pixel 503 for generating the corresponding reset voltage and the corresponding image signal voltage (fifth and sixth arrows from the left in FIG. 6). Furthermore, the control signals Rx1, Sx1, and TG4 are controlled similarly for the pixel 204 for generating the corresponding reset voltage and the corresponding image signal voltage (seventh and eight arrows from the left in FIG. 6).

In this manner, the respective photocurrent from each of the pixels 501, 502, 503, and 504 is used to generate the respective image data signal as Vout separately and sequentially via the signal converter 511 for capturing the still image. Similarly, the respective photocurrent from each of the pixels 505, 506, 507, and 508 from the second column is used to generate the respective image data signal as Vout separately and sequentially via the signal converter 512 for capturing the still image.

Figure 7:
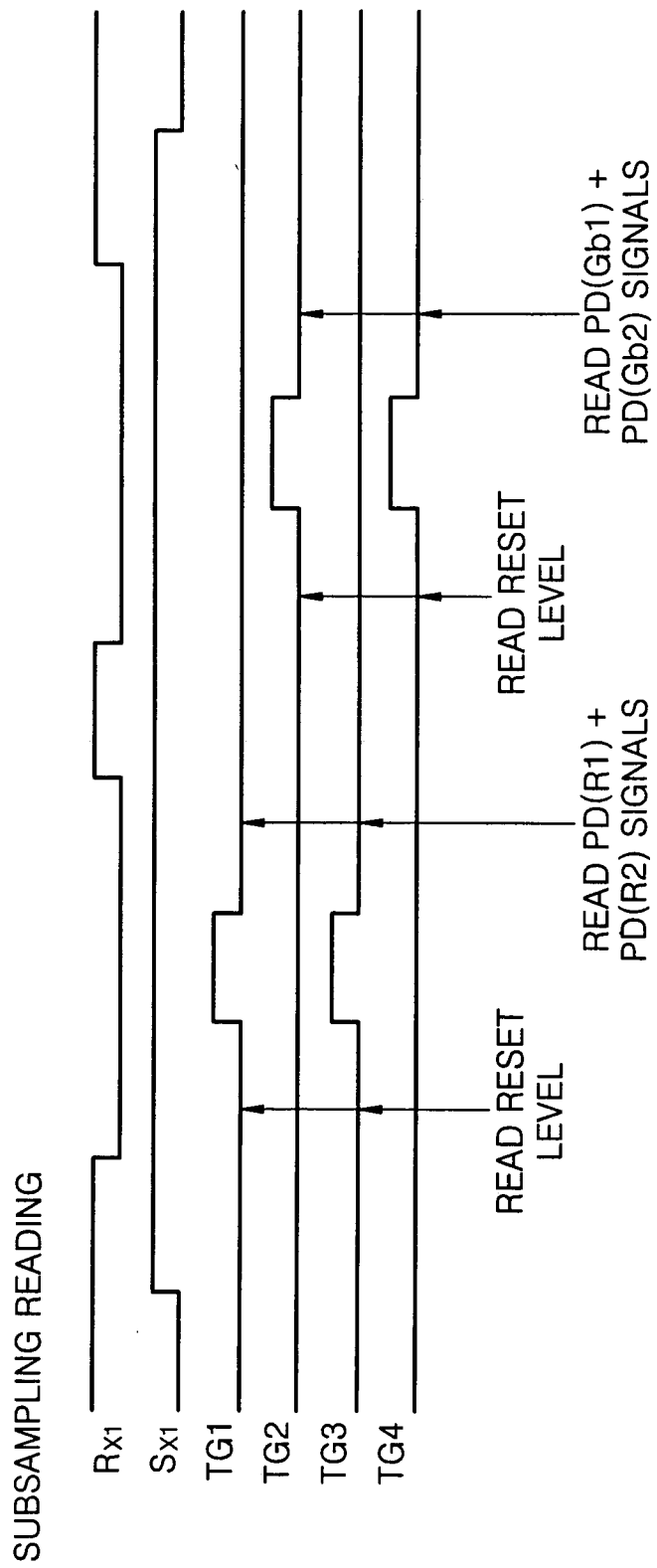
FIG. 7 is a signal timing diagram for capturing a moving image using the CMOS image sensor of FIG. 5, according to an embodiment of the present invention.

FIG. 7 is a signal timing diagram of control signals Rx1, Sx1, TG1, TG2, TG3, and TG4 generated by the driver 520 of FIG. 9 when the CMOS image sensor 500 of FIG. 5 captures a moving image. Control signals from a controller (not shown) indicate to the driver 520 whether a still image or a moving image is to be captured.

Initially, the reset control signal Rx1 is set to logic high while the transfer control signals TG1, TG2, TG3, and TG4 are logic low for resetting the pixels. Thereafter, after the reset control signal Rx1 is logic low and the select control signal Sx1 is logic high, the reset voltage for the non-adjoining pixels 501 and 503 is output as Vout (left-most arrows in FIG. 7).

Subsequently, transfer control signals TG1 and TG3 applied on the transfer MOSFETs M11 and M31 are simultaneously activated to logic high as pulse signals. Thus, the photocurrents from the two non-adjoining pixels 501 and 503 for receiving red light are transferred to the floating diffusion area (i.e., the gate of M13). Such photocurrents are summed at the gate of M13 to generate a corresponding image signal voltage as Vout (second arrows from the left in FIG. 7).

Thereafter, the reset control signal Rx1 is activated to logic high while the transfer control signals TG1, TG2, TG3, and TG4 are logic low for resetting the pixels again. Subsequently, after the reset control signal Rx1 is logic low and the select control signal Sx1 is logic high, the reset voltage for the non-adjoining pixels 502 and 504 is output as Vout (third arrows from left in FIG. 7).

Thereafter, transfer control signals TG2 and TG4 applied on the transfer MOSFETs M21 and M41 are simultaneously activated to logic high as pulse signals. Thus, the photocurrents from the two non-adjoining pixels 502 and 504 for receiving green light are transferred to the floating diffusion area (i.e., the gate of M13). Such photocurrents are summed at the gate of M13 to generate a corresponding image signal voltage as Vout (fourth arrows from the left in FIG. 7).

In this manner, photocurrents from multiple pixels are added before the image signal voltage is generated as Vout for capturing a moving image in the CMOS image sensor 500. Thus, the CMOS image sensor 500 has lower operating frequency and power consumption than the conventional image sensor that reads all pixels with averaging through image signal processing (ISP).

In addition, because photocurrents from all pixels are processed, moving images of high quality are captured. Furthermore, with the shared FD pixel structure, the area of the CMOS image sensor 500 is reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

Thus, the foregoing is by way of example only and is not intended to be limiting. For example, any numbers of elements or circuit topology illustrated and described herein are by way of example only. In addition, the present invention has been described for a CMOS image sensor. However, the present invention may also be used for any other type of image sensors. Furthermore, any type of switching element may be used for any of the MOSFETs of the CMOS image sensors 200 and 500 of FIGS. 2 and 5. The present invention is limited only as defined in the following claims and equivalents thereof.

What is claimed is:

1. An image sensor comprising:
   a first set of at least two pixels each sensing light of a same first color;
   a signal converter coupled to the first set of pixels; and
   a driver for turning on a respective switching element within each pixel of the first set for simultaneously coupling a respective photocurrent from a respective photodiode for each pixel of the first set to the signal converter,
   wherein each pixel of the first set has a transfer transistor, and wherein at least two transfer transistors of the first set are electrically connected to a common floating diffusion node.

2. The image sensor of claim 1, wherein the first set of pixels is within a same column of an array of pixels of the image sensor.

3. The image sensor of claim 2, wherein the first set is comprised of two pixels that are non-adjoining in the column.

4. The image sensor of claim 3, wherein another one pixel for sensing a different color is disposed between the two pixels.

5. The image sensor of claim 4, wherein only the two pixels of the first set for sensing light of the same first color are coupled to the signal converter.

6. The image sensor of claim 4, further comprising:
   a second set of at least two pixels each for sensing a same second color and each coupled to the signal converter, and wherein the driver turns on a respective switching element within each pixel of the second set for simultaneously coupling a respective photocurrent from a respective photodiode for each pixel of the second set to the signal converter.

7. The image sensor of claim 6, wherein the array of pixels of the image sensor have a Bayer color pattern, and wherein a pixel from the first set and a pixel from the second set alternate along a column of the array.

8. The method of claim 4, further comprising:
   coupling simultaneously a respective photocurrent from a respective photodiode for each pixel of a second set of at least two pixels to the signal converter, for capturing the moving image;
   wherein each pixel of the second set is for sensing light of a same second color; and
   coupling separately the respective photocurrent from the respective photodiode for each pixel of the second set to the signal converter, for capturing the still image.

9. The method of claim 8, wherein the array of pixels of the image sensor have a Bayer color pattern, and wherein a pixel from the first set and a pixel from the second set alternate along a column of the array.

10. The image sensor of claim 1, further comprising:
    a second set of at least two pixels each for sensing a same second color and each coupled to the signal converter, and wherein the driver turns on a respective switching element within each pixel of the second set for simultaneously coupling a respective photocurrent from a respective photodiode for each pixel of the second set to the signal converter.

11. The image sensor of claim 1,
    wherein the driver simultaneously couples the respective photocurrent from the respective photodiode for each pixel of the first set to the signal converter, for capturing a moving image;
    and wherein the driver separately couples the respective photocurrent from the respective photodiode for each pixel of the first set to the signal converter, for capturing a still image.

12. The image sensor of claim 1, wherein the image sensor is a CMOS image sensor, and wherein each pixel of the CMOS image sensor includes only a photodiode and a transfer transistor.

13. A method of driving an image sensor comprising:
    coupling simultaneously a respective photocurrent from a respective photodiode for each pixel of a first set of at least two pixels to a signal converter, for capturing a moving image;

wherein each pixel of the first set has a transfer transistor, and wherein at least two transfer transistors of the first set are electrically connected to a common floating diffusion node;

and wherein each pixel of the first set is for sensing light of a same first color; and coupling separately the respective photocurrent from the respective photodiode for each pixel of the first set to the signal converter, for capturing a still image.

14. The method of claim 13, wherein the first set of pixels is within a same column of an array of pixels of the image sensor.

15. The method of claim 14, wherein the first set is comprised of two pixels that are non-adjoining in the column.

16. The method of claim 15, wherein another one pixel for sensing a different color is disposed between the two pixels.

17. The method of claim 16, wherein only the two pixels of the first set for sensing light of the same first color are coupled to the signal converter.

18. The method of claim 13, further comprising:

coupling simultaneously a respective photocurrent from a respective photodiode for each pixel of a second set of at least two pixels to the signal converter, for capturing the moving image;

wherein each pixel of the second set is for sensing light of a same second color; and coupling separately the respective photocurrent from the respective photodiode for each pixel of the second set to the signal converter, for capturing the still image.

19. The method of claim 18, wherein the respective photocurrent for each pixel of only one of the first or second sets of pixels is simultaneously coupled to the signal converter, for capturing the moving image.

20. The method of claim 13, wherein the image sensor is a CMOS image sensor, and wherein each pixel of the CMOS image sensor only includes a photodiode and a transfer transistor.

* * * * *